United States Patent
Kang et al.

(10) Patent No.: US 8,203,091 B2
(45) Date of Patent: Jun. 19, 2012

(54) SWITCH ASSEMBLY AND AIR CONDITIONER HAVING THE SAME

(75) Inventors: Gyung Yeun Kang, Hwaseong-si (KR); Hong Joo Kang, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 368 days.

(21) Appl. No.: 12/585,008

(22) Filed: Aug. 31, 2009

(65) Prior Publication Data

US 2010/0170276 A1    Jul. 8, 2010

(30) Foreign Application Priority Data

Jan. 6, 2009    (KR) .................. 10-2009-0000713

(51) Int. Cl.
*H01H 9/00*    (2006.01)
(52) U.S. Cl. ...................................................... 200/314
(58) Field of Classification Search .................. 200/314, 200/317, 341, 310–313; 62/259.1
See application file for complete search history.

(56) References Cited

U.S. PATENT DOCUMENTS

| | | | | |
|---|---|---|---|---|
| 4,446,614 A * | 5/1984 | Haag | | 29/622 |
| 4,449,774 A * | 5/1984 | Takashi et al. | | 439/590 |
| 5,268,542 A * | 12/1993 | Voll | | 200/5 A |
| 5,391,848 A * | 2/1995 | Murphy | | 200/314 |
| 5,917,165 A * | 6/1999 | Platt et al. | | 200/600 |
| 2002/0153239 A1* | 10/2002 | Yoshida et al. | | 200/520 |

FOREIGN PATENT DOCUMENTS

| | | | |
|---|---|---|---|
| KR | 10-2004-0059640 | | 7/2004 |
| KR | 10-2006-0008708 | | 1/2006 |
| KR | 10-2008-0075712 | | 8/2008 |
| WO | WO 2009/054592 | * | 4/2009 |

* cited by examiner

*Primary Examiner* — Edwin A. Leon
(74) *Attorney, Agent, or Firm* — Ataas & Halsey LLP

(57) ABSTRACT

A switch and a circuit board of the switch assembly are detachably coupled to each other, thus resulting in enhanced maintenance and workability. The switch assembly includes a switch to sense an electrical signal of a human body, a conductive connector to provide the switch with an elastic force, and a circuit board adapted to receive the electrical signal through the connector so as to perform a control operation. The circuit board is detachably coupled with the switch.

19 Claims, 9 Drawing Sheets

SWITCH ASSEMBLY AND AIR CONDITIONER HAVING THE SAME

CROSS-REFERENCE TO RELATED APPLICATIONS

This application claims the benefit of Korean Patent Application No. 2009-0000713, filed on Jan. 6, 2009 in the Korean Intellectual Property Office, the disclosure of which is incorporated herein by reference.

BACKGROUND

1. Field

Embodiments of the present invention relate to a switch assembly to assure detachable coupling of a switch and a circuit board and an air conditioner having the same.

2. Description of the Related Art

Generally, an air conditioner is an appliance to adjust, e.g., temperature or humidity of air using transfer of heat generated during evaporation and condensation of refrigerant.

A front panel defining a front surface of a general air conditioner is provided at a lower part thereof with a suction hole for suction of indoor air. After the suctioned air is processed in a body of the air conditioner, the air is again discharged into an indoor space through a discharge hole provided in an upper part of the front panel.

The body of the air conditioner receives a heat exchanger for heat exchange of the suctioned air, and a blower fan to forcibly blow the heat-exchanged air toward the discharge hole.

In addition, the front panel of the air conditioner is provided with an operating unit. The operating unit includes a display part to display the operating status of the air conditioner, and a plurality of input elements to allow a user to freely operate the air conditioner.

The plurality of input elements generally has a forwardly protruding configuration and is always visible from the front regardless of whether or not a user intends to operate the air conditioner, resulting in an unattractive design.

Also, a plurality of switch assemblies of a touch switching type is arranged at the rear of the plurality of input elements. Each switch assembly includes a switch and a circuit board having a plurality of electric circuits, the switch being connected to the circuit board via solder. Accordingly, if the circuit board or switch malfunctions, the circuit board itself may be replaced, resulting in inefficient maintenance and repair of products.

SUMMARY

Therefore, it is an aspect of the present invention to provide a switch assembly, a switch and a circuit board of which are detachably coupled to each other, thus resulting in enhanced maintenance and workability, and an air conditioner having the same.

Additional aspects of the invention will be set forth in part in the description which follows and, in part, will be apparent from the description, or may be learned by practice of the invention.

The foregoing and/or other aspects of the present invention are achieved by providing a switch assembly includes a switch to sense an electrical signal of a user, a conductive connector to provide the switch with an elastic force, and a circuit board to receive the electrical signal through the connector so as to perform a control operation, the circuit board being detachably coupled with the switch.

The circuit board may include at least one light emitting element.

The switch may include a cylindrical body defining an external appearance of the switch, and at least one fastening piece extending from the body and adapted to be hook-coupled to the circuit board.

The connector and the switch respectively may include through-bores, through which light emitted from the light emitting element is irradiated to the outside.

The through-bore of the switch may include a first hole in close contact with the connector, and a second hole having a diameter larger than a diameter of the first hole to allow the light having passed through the first hole to be irradiated to the outside.

The switch may include a seating recess for placement of the connector.

The connector may be placed in the seating recess and may be made of a flexible gasket material to achieve electrical conduction between the switch and the circuit board when the switch is pushed.

The light emitting element may include a Light Emitting Diode (LED).

The switch may be plated with chrome.

The switch may include a supporting piece configured to be inserted into the circuit board.

The fastening piece may include a protrusion to be caught by the circuit board.

The foregoing and/or other aspects of the invention may also be achieved by providing an air conditioner includes a button and a switch assembly to sense an electrical signal generated upon selection of the button by a user, and the switch assembly includes a conductive switch provided at a position corresponding to the button, a conductive connector to provide the switch with an elastic force, and a circuit board detachably coupled with the switch and the connector.

The circuit board may include at least one Light Emitting Diode (LED) adapted to selectively emit light.

The switch may include a fastening piece to be hook-coupled to the circuit board.

Each of the connector and the switch may include at least one through-bore to prevent dispersion of the light emitted from the LED.

The connector may be made of a flexible gasket material.

BRIEF DESCRIPTION OF THE DRAWINGS

These and/or other aspects of the invention will become apparent and more readily appreciated from the following description of the embodiments, taken in conjunction with the accompanying drawings of which.

DETAILED DESCRIPTION OF EMBODIMENTS

Figure 1:
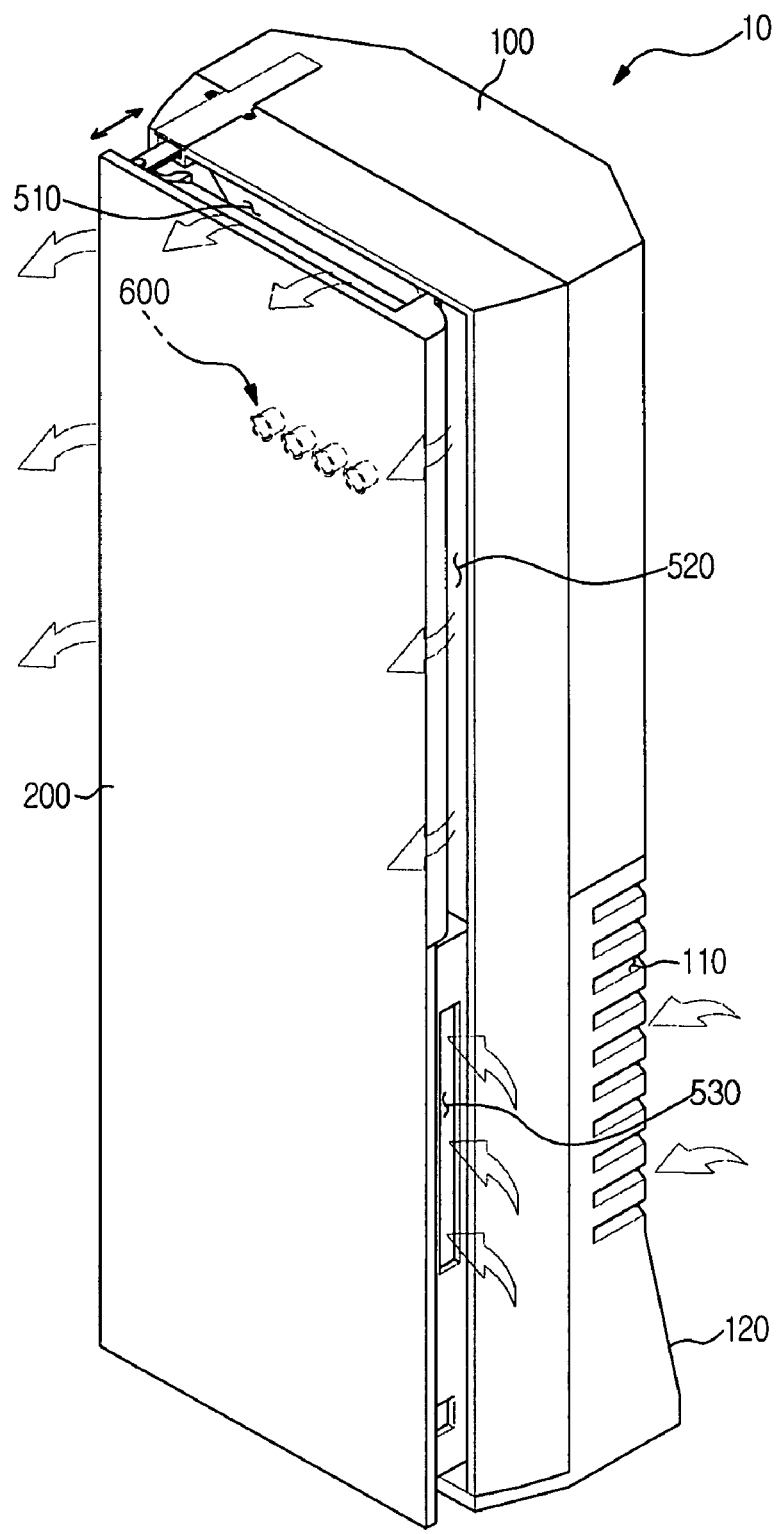
FIG. 1 is a perspective view illustrating an external appearance of an air conditioner according to an embodiment of the present invention.

Reference will now be made in detail to the embodiments of the present invention, examples of which are illustrated in the accompanying drawings, wherein like reference numerals refer to the like elements throughout.

Figure 2:
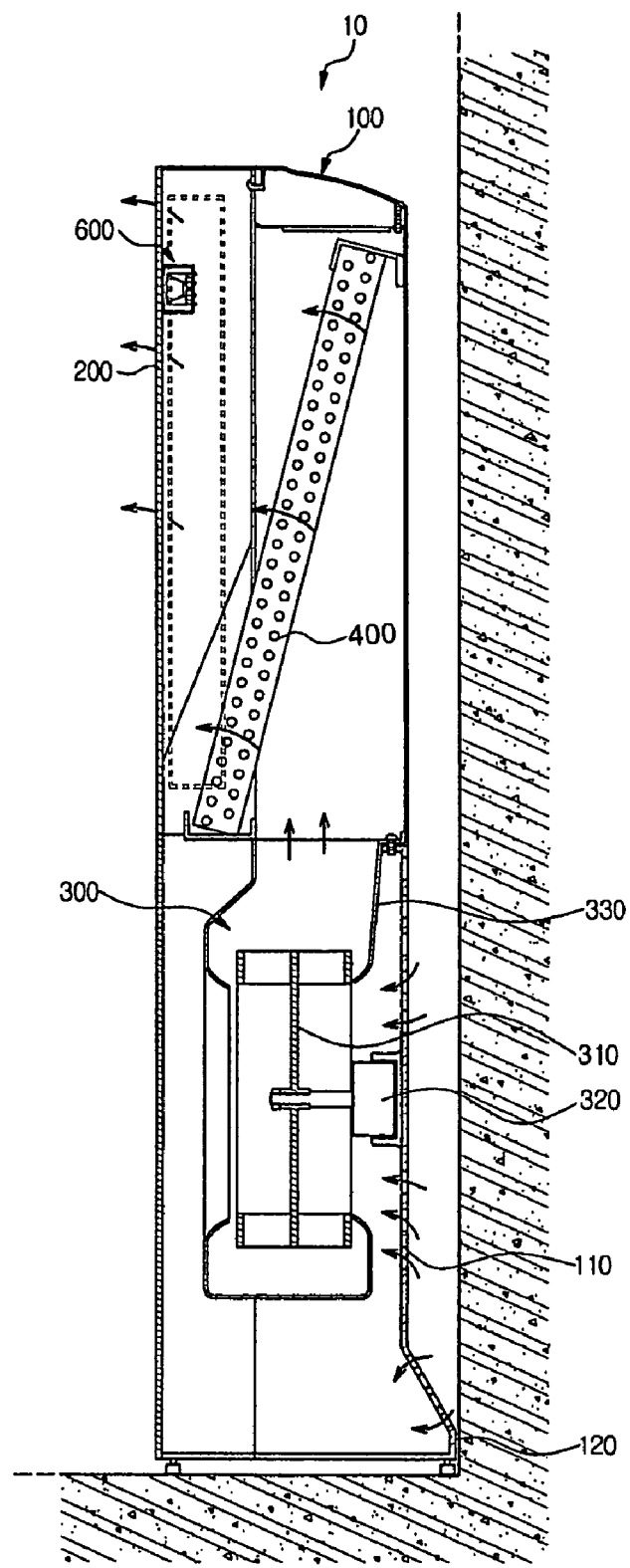
FIG. 2 is a sectional view illustrating an internal configuration of the air conditioner according to the embodiment.
Figure 3:
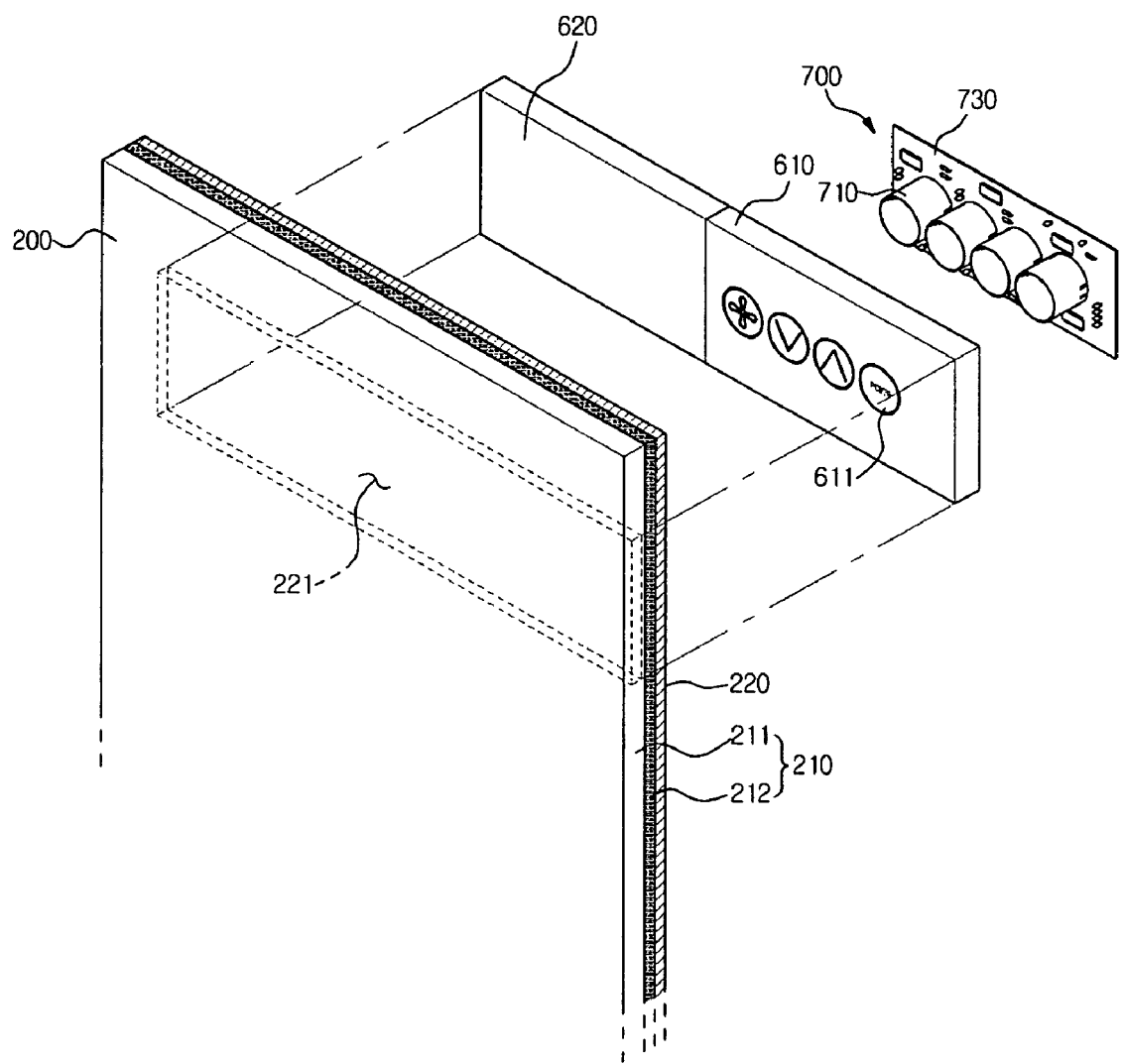
FIG. 3 is a perspective view illustrating an input part of the air conditioner according to the embodiment.

FIG. 1 is a perspective view illustrating an external appearance of an air conditioner according to an embodiment of the present invention, FIG. 2 is a sectional view illustrating an internal configuration of the air conditioner according to the embodiment, and FIG. 3 is a perspective view illustrating an input part of the air conditioner according to the embodiment.

As shown in FIGS. 1 to 3, the air conditioner 10 according to the embodiment includes a body 100 having an open front side, and a front panel 200 provided at the front side of the body 100.

A blowing unit 300 is arranged in a lower region of the body 100 and serves to circulate indoor air. Also, a heat exchanger 400 is arranged in an upper region of the body 100 and serves to cool or heat the indoor air circulated by the blowing unit 300.

The blowing unit 300 includes a blowing fan 310, a fan motor 320 to drive the blowing fan 310, and a fan casing 330 to guide the blown air toward the heat exchanger 400. The blowing fan 310 may be a bidirectional suction type centrifugal fan that suctions air in an axial direction from both the front and the rear thereof and discharges the suctioned air in a radial direction.

The body 100 may be formed in a lower rear surface thereof with a rear suction hole 110 for suction of indoor air. The body 100 may have a supporting portion 120 protruding rearward from a lower end thereof to allow the body 100 to be more stably supported on the indoor floor. The supporting portion 120 also serves to space the rear surface of the body 100 from the surrounding wall surface, allowing indoor air to be more effectively suctioned through the rear suction hole 110 formed in the rear surface of the body 100.

The front panel 200 may be movable forward and rearward to open or close the front side of the body 100. The front panel 200 is kept in close contact with the body 100 when the air conditioner 10 is off. Then, if the air conditioner 10 begins to be operated, the front panel 200 is moved forward by a predetermined distance via operation of a drive unit (not shown). Thereby, a space between the rim of the body 100 and the rim of the front panel 200 is opened, creating an upper discharge hole 510 and lateral discharge holes 520 and 530.

In the air conditioner 10 according to the embodiment, the discharge holes 510, 520 and 530 are exposed to the outside only during operation of the air conditioner 10. Moreover, since the discharge holes 510, 520 and 530 are located at the rim of the air conditioner 10, which is not easily visible, the air conditioner 10 provides a user with a pleasing appearance even during operation of the air conditioner 10.

The front panel 200 has no protrusion, indentation or perforation and defines a flat plane. The front panel 200 is provided at an upper part thereof with an operating unit 600.

The operating unit 600 includes an input part 610 to be selectively pushed by the user for operation of the air conditioner 10. The operating unit 600 is fixed at a rear surface of the front panel 200 so as not to deteriorate evenness of a front surface of the front panel 200.

Specifically, as shown in FIG. 3, the operating unit 600 according to the embodiment is hidden by the front panel 200 when the air conditioner 10 is off and thus, the input part 610 is invisible from the front of the front panel 200.

The front panel 200 is designed such that, during operation of the air conditioner 10, the operating status of the air conditioner 10 may be displayed on the front surface of the front panel 200 without deterioration in the design consistency of the front surface, whereas the operating unit 600 is invisible from the front surface when the air conditioner 10 is off for harmonization between the front surface of the air conditioner 10 and the surrounding interior design.

For this, the front panel 200 according to the embodiment may include a semi-transparent front member 210 and a rear plate 220, which have the same size and shape and overlap each other.

The semi-transparent member 210 may be wholly semi-transparent. Specifically, the semi-transparent member 210 may include a transparent glass 211 and a semi-transparent layer 212 in the form of, e.g., a sheet or film attached to the overall front or rear surface of the glass 211. Alternatively, the semi-transparent member 210 may be formed of a semi-transparent synthetic resin plate. The rear plate 220 may have an opening 221 for placement of the operating unit 600.

The operating unit 600 provided at the rear of the front panel 200 is used to input a variety of operating commands of the air conditioner 10. The operating unit 600 includes the input part 610 to be selectively pushed during operation of the air conditioner 10, and switch assemblies 700 provided to correspond to the input part 610 and adapted to control operation of the air conditioner 10 based on sensed human body current.

The input part 610 includes a plurality of buttons 611 to be selectively pushed during operation of the air conditioner 10. A display part 620 may be provided at one side of the input part 610.

A plurality of the switch assemblies 700 is provided at the rear of the input part 610 at positions respectively corresponding to the buttons 611. Each of the switch assemblies 700 senses that the user touches the corresponding button 611, sending an electrical signal to a controller (not shown). The switch assembly 700 will be described hereinafter with reference to FIGS. 4 to 6.

Figure 4:
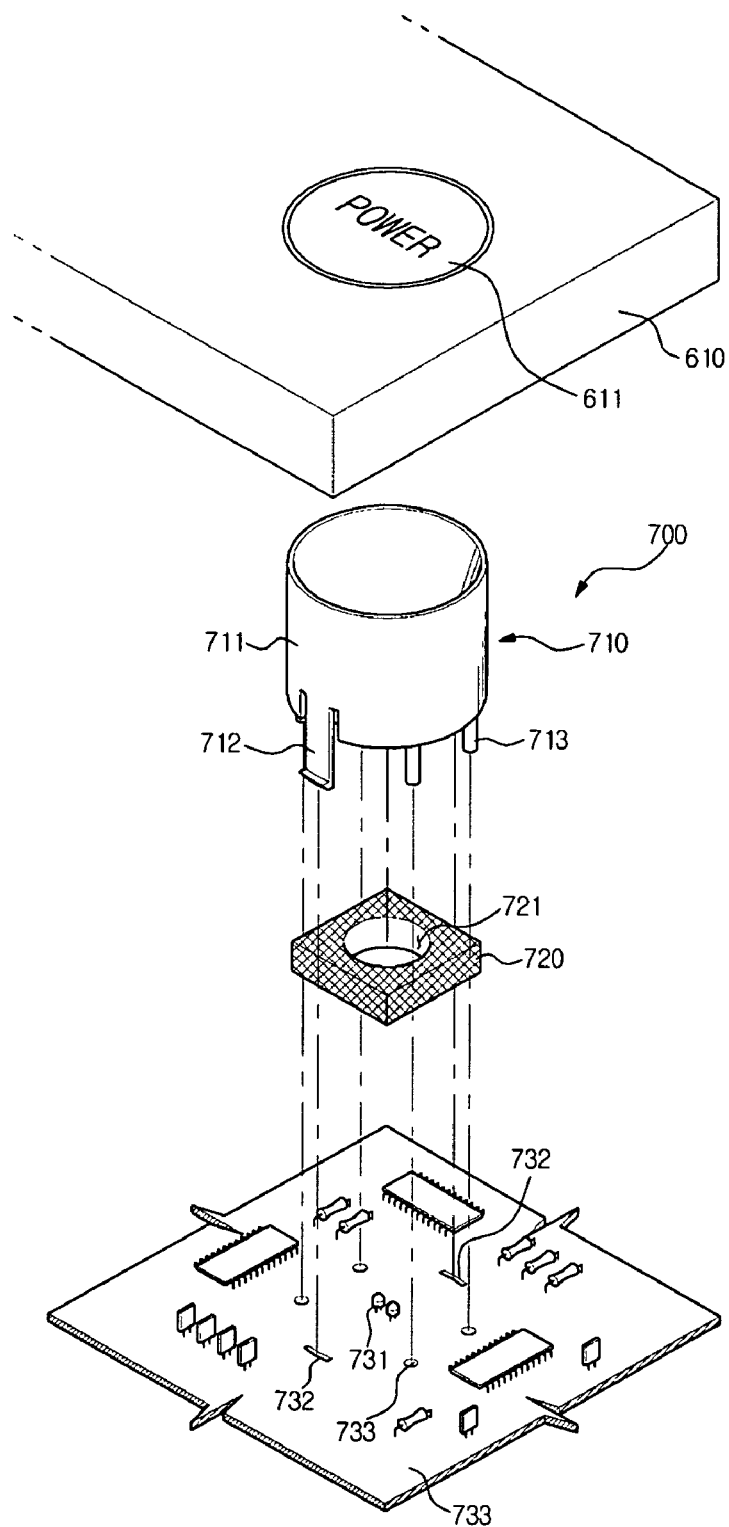
FIG. 4 is an exploded perspective view illustrating a switch assembly according to the embodiment.
Figure 5:
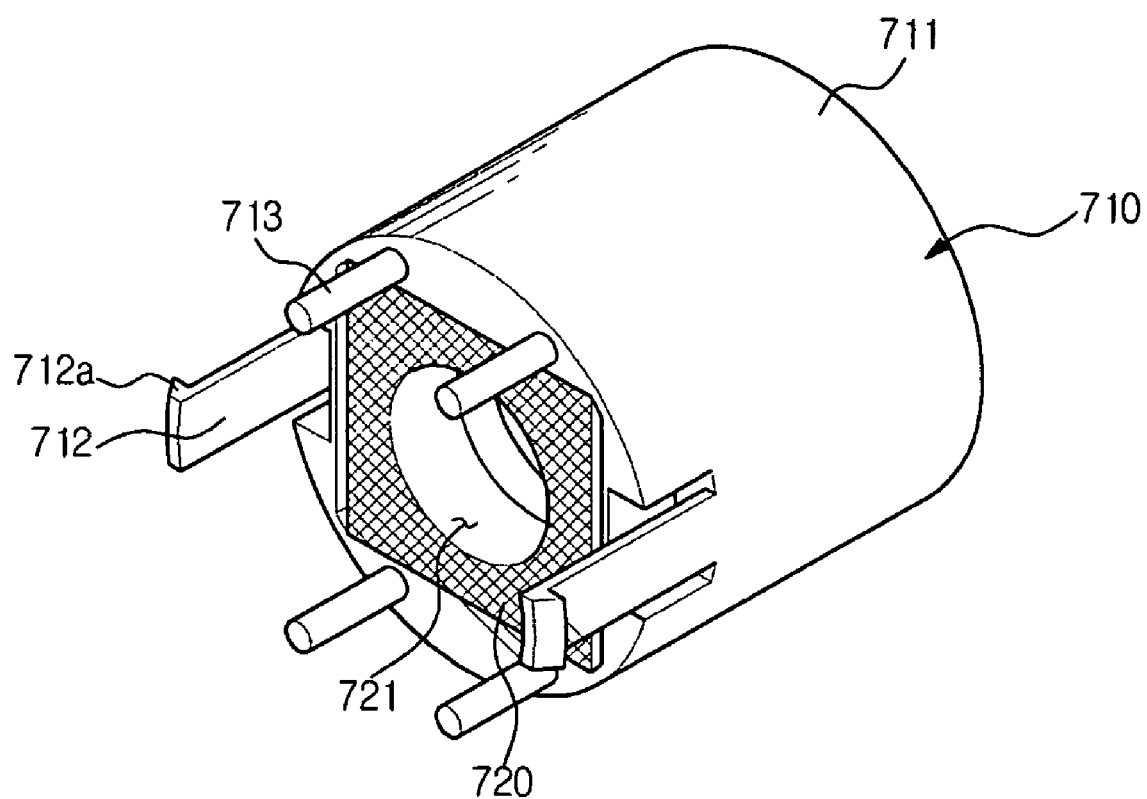
FIG. 5 is a perspective view illustrating an assembled state of a switch shown in FIG. 4.
Figure 6:
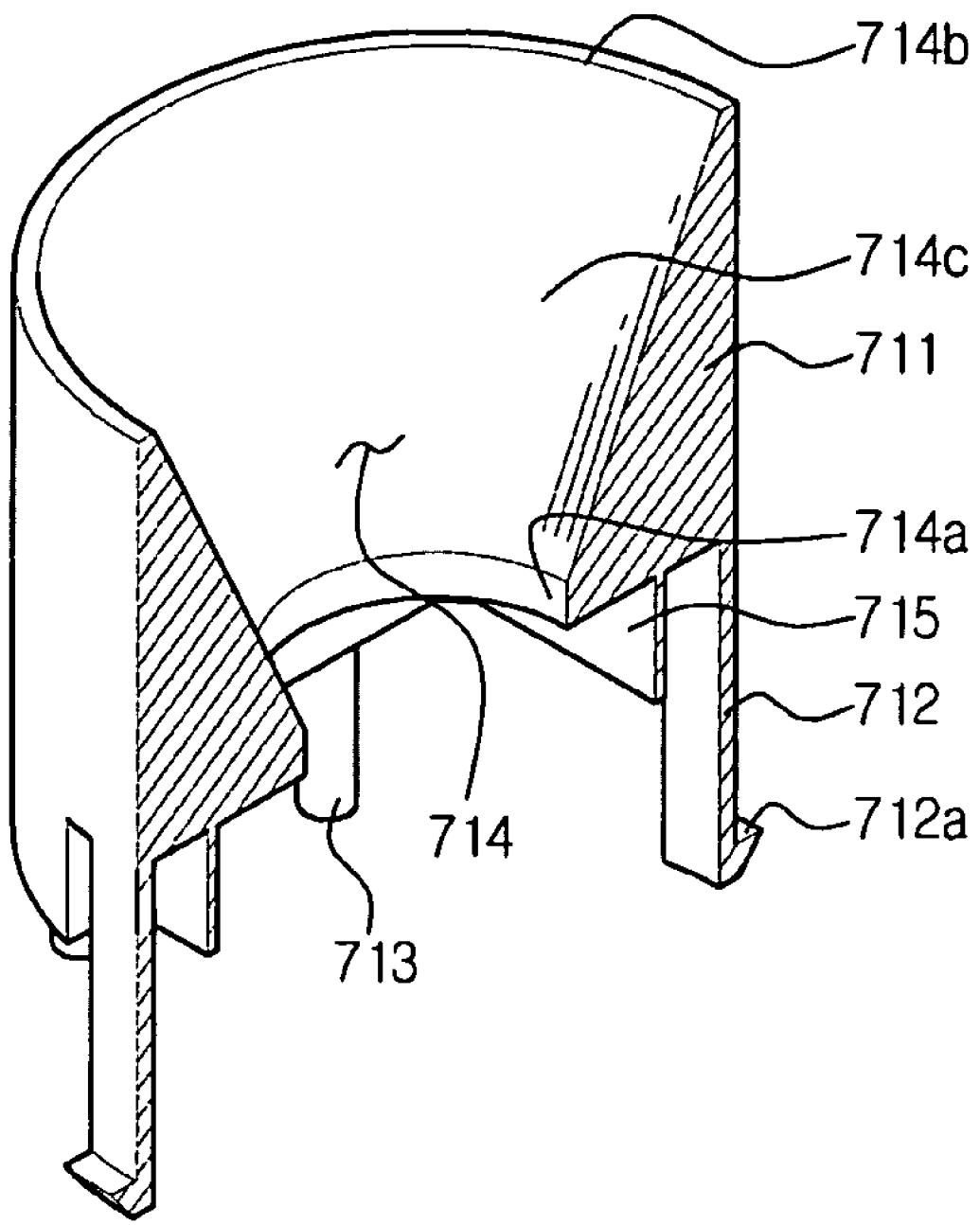
FIG. 6 is a perspective view illustrating the cross section of the switch shown in FIG. 4.

FIG. 4 is an exploded perspective view illustrating the switch assembly according to the embodiment of the present invention, FIG. 5 is a perspective view illustrating an assembled state of a switch shown in FIG. 4, and FIG. 6 is a perspective view illustrating the cross section of the switch shown in FIG. 4.

As shown in FIGS. 4 to 6, the switch assembly 700 according to the embodiment includes a switch 710 to sense an electrical signal of the human body, a conductive connector 720 to provide the switch 710 with elastic force, and a circuit board 730 detachably coupled with the switch 710, the circuit board 730 performing a control operation upon receiving the electrical signal transmitted through the connector 720.

The switch 710 is made of an electrically conductive material and may sense human body current. That is, if the human body touches the button 611, electric current is created by capacitance between the button 611 and the switch 710, causing the switch 710 to input an electrical signal.

The switch 710 includes a cylindrical body 711 defining an external appearance of the switch 710, and fastening pieces 712 extending from the body 711 so as to be hook-coupled to the circuit board 730.

The switch 710 has a through-bore 714 penetrating therethrough. The through-bore 714 includes a first hole 714a and a second hole 714b, which have different diameters, and is penetrated through the body 711. The first hole 714a and second hole 714b are connected via a slope 714c having a predetermined inclination to assure the different diameters of the first hole 714a and second hole 714b. The inclination of the slope 714c may be appropriately adjusted to coincide with a light irradiation angle of a Light Emitting Diode (LED) 731 that will be described hereinafter. For example, if the LED 731 provided at the circuit board 730 is adapted to irradiate light by approximately 120 degrees, the inclination of the slope 714 may be approximately 120 degrees.

The switch 710 has a seating recess 715 indented from a lower surface thereof by a predetermined width and depth. The connector 720 is attached in the seating recess 715 and more particularly, is fixed in the seating recess 715 by use of a double-sided tape 716.

The switch assembly 700 according to the embodiment may include a predetermined connector to connect the switch 710 and circuit board 730 to each other. The connector serves to assure that a touch signal of the switch 710 is accurately transmitted to the circuit board 730.

Accordingly, the body 711 may be plated with chrome to sense the human body current. The switch 710 has the fastening pieces 712 extending from the body 711 and adapted to be detachably coupled to the circuit board 730. The fastening pieces 712 extend downward from opposite sides of the rim of the body 711 so as to achieve hook-coupling between the switch 710 and the circuit board 730. A distal end of each fastening piece 712 is formed with a protrusion 712a such that the protrusion 712a may be fitted into and caught by a first hole 732 of the circuit board 730.

The switch 710 further has supporting pieces 713 extending from the body 711 and configured to be inserted into the circuit board 730. To allow the circuit board 730 and switch 710 to be stably coupled to each other at an accurate position as the fastening pieces 712 are coupled to the circuit board 730, the supporting pieces 713 extend downward at positions between the fastening pieces 712 and may be fitted into second holes 733 of the circuit board 730.

Although the two fastening pieces 712 of the switch 710 are illustrated as being linearly aligned at opposite sides of the rim of the body 711 and the four supporting pieces 713 are illustrated as being located between the fastening pieces 712, of course, the number of the fastening pieces 712 and supporting pieces 713 of the switch 710 may be determined variously to assure stable coupling of the circuit board 730 and switch 710 at an accurate position.

The connector 720 is made of an elastic material to be shrinkable to some extent because a spacing distance between the switch 710 and the circuit board 730 in the form of a flat plate is not constant. Accordingly, the connector 720 may be made of the same material as, e.g., a gasket having both conductivity and elasticity. Accordingly, the switch 710 may be pushed using elasticity of the connector 720 and simultaneously, may realize transmission of the electrical signal from the switch 710 to the circuit board 730.

The circuit board 730 is provided at a predetermined position thereof with at least one light emitting element 731 to enable selective light emission from the switch 710 and button 611. Light emitted from the light emitting element 731 is irradiated to the outside of the switch 710 by passing through the connector 720, thereby enabling light emission of the corresponding button 611.

The light emitting element 731 may include an LED 731 as a luminescent diode. The LED 731 is directly mounted on the circuit board 730.

The LED 731 is surrounded by the connector 720 and switch 710 such that light emitted from the LED 731 is irradiated to the outside of the switch assembly 700 through a through-bore 721 of the connector 720 and the through-bore 714 of the switch 710. The first hole 714a of the through-bore 714 may have a relatively small diameter to allow the light emitted from the LED 731 to be focused rather than spreading out. The second hole 714b of the through-bore 714 may have a diameter larger than that of the first hole 714a in correspondence with a size of the corresponding button 611, to allow the light having passed through the first hole 714a to be irradiated only to the corresponding button 611.

Next, the assembly operation and effects of the switch assembly having the above-described configuration will be described.

Figure 7:
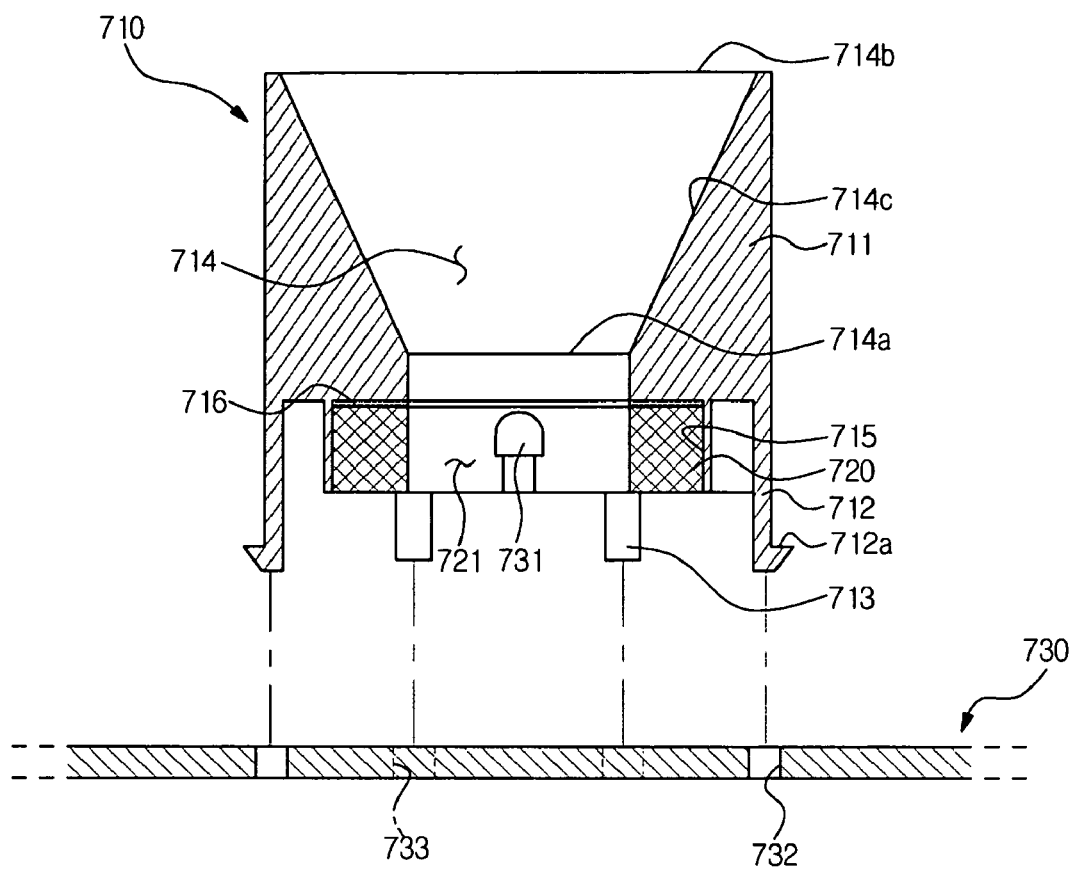
FIGS. 7 to 9 are sectional views illustrating an assembly sequence of the switch assembly.
Figure 8:
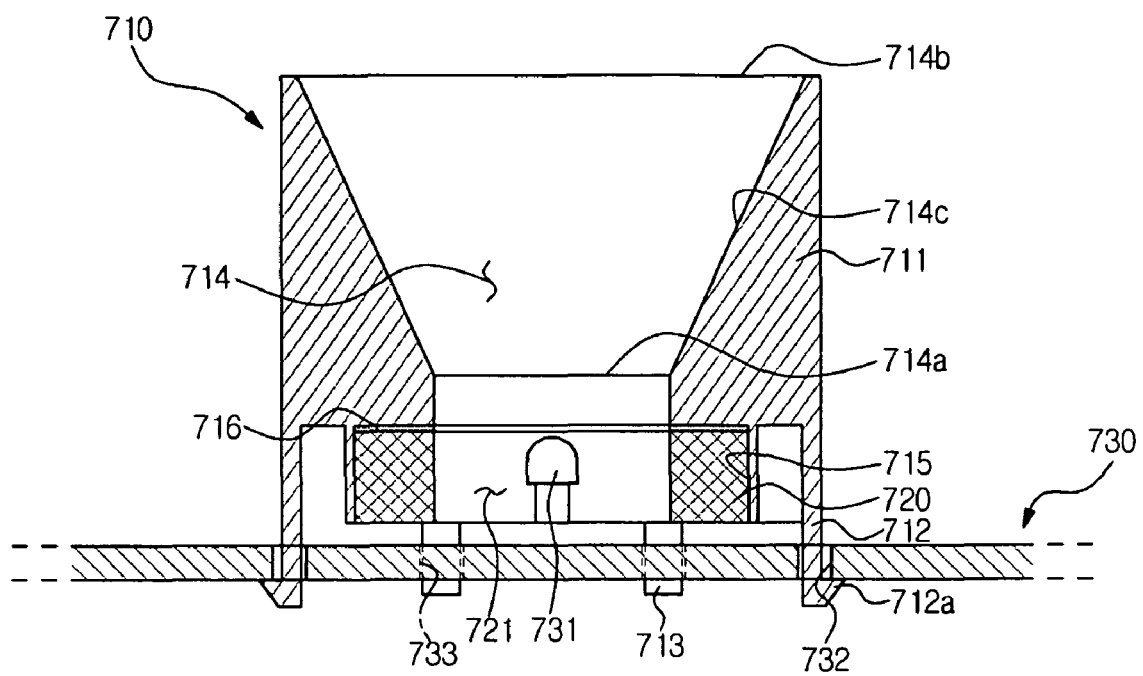
Figure 9:
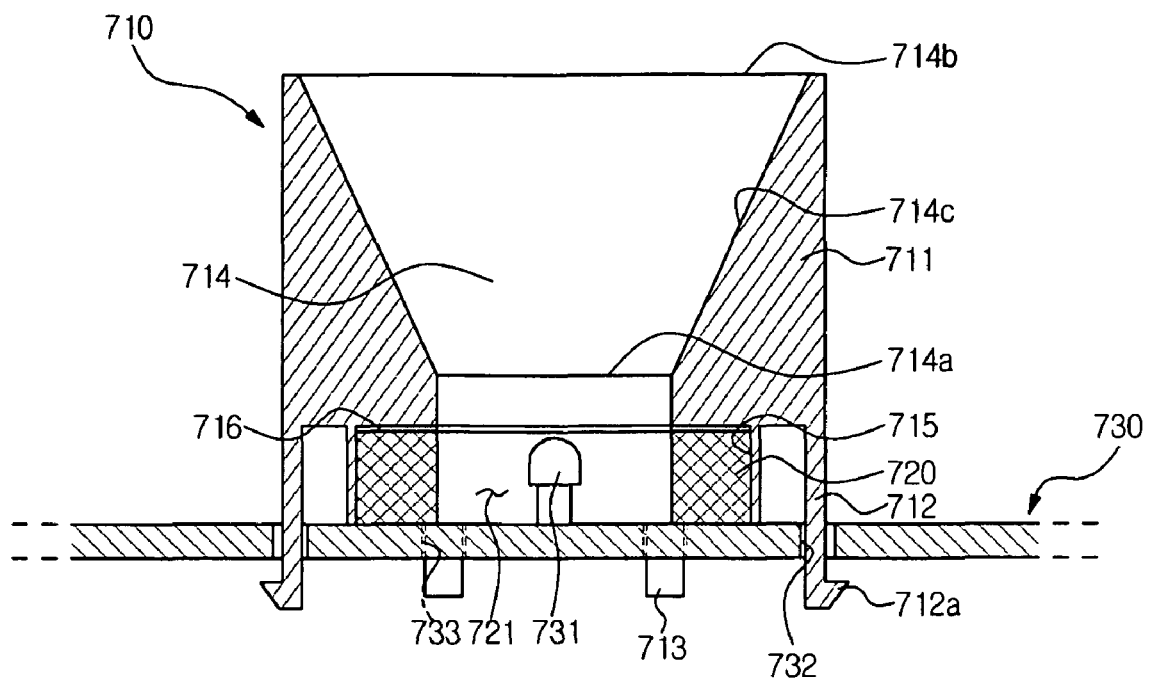

FIGS. 7 to 9 are sectional views illustrating the switch assembly before and after assembly. First, as shown in FIG. 7, the connector 720 made of the gasket material may be fixed to the seating recess 715 of the switch 710 by use of the double-sided tape 716.

Then, as shown in FIG. 8, the supporting pieces 713 of the switch 710 are inserted into the second holes 733 of the circuit board 730, and the fastening pieces 712 of the switch 710 are fitted into the first holes 732 of the circuit board 730, enabling assembly of the switch 710 and the circuit board 730.

In this case, the fastening pieces 712 of the switch 710 may be coupled to the circuit board 730 as the protrusions 712a thereof are caught by the first holes 732. The elastic connector 720 is located in the center of the switch 710 and acts to return the switch 710 to an original position thereof. Of course, to allow a touch signal of the switch 710 to be accurately transmitted to the circuit board 730, the connector 720 may be assembled to accurately coincide with a previously designed region of the circuit board 730.

Next, as shown in FIG. 9, if the user pushes the switch 710 via the input part 610, the switch 710 is moved to come into close contact with the circuit board 730. Thereby, the connector 720 may transmit an electrical signal sensed by the switch 710 to the circuit board 730.

Now, the operation of the air conditioner including the above-described switch assembly will be described.

The air conditioner 10 according to the embodiment employs touch switches such that the operation of the air conditioner 10 may be controlled based on electrical signals generated by contact with the human body. Accordingly, if an operating signal is generated as the human body, i.e. the user's finger touches the input part 610, operation of the air conditioner may be controlled based on the operating signal by the controller (not shown).

More particularly, if the finger touches the input part 610, the switch 710 is charged by human body current. Thereby, power is supplied to the LED 731, enabling light emission of the LED 731.

The LED 731 irradiates light to indicate operational information of the air conditioner 10, and the irradiated light is directed forward from the rear of the semi-transparent member 210 of the front panel 200 by passing through the semi-transparent member 210. Accordingly, the user may see the light having passed through the semi-transparent member 210 of the front panel 200 and may easily recognize the operational information of the air conditioner 10.

Here, since the LED 731 is surrounded by the connector 720, the light emitted from the LED 731 is not dispersed outward and is irradiated only to the corresponding button 611 via the through-bore 714 of the switch 710.

If the user inputs an operation halt command of the air conditioner 10 using the input part 610, the controller (not shown) turns off the air conditioner 10 and the switch assembly 700 no longer irradiates light. Accordingly, the rear of the front panel 200 is invisible from the front of the front panel 200.

In the switch assembly 700 according to the embodiment of the present invention, since the switch 710 is detachably coupled to the circuit board 730, the switch 710 may be easily replaced without replacement of the overall circuit board 730, resulting in enhanced maintenance and workabililty.

Further, since the switch assembly 700 according to the embodiment is dividable into two or three parts, the overall configuration of the switch assembly 700 is simplified, resulting in reduced manufacturing costs thereof.

Furthermore, as the light emitting element 731 is located on the circuit board 730 to coincide with the center of the through-bores 712 and 714 of the connector 720 and switch 710 and is surrounded by the connector 720, the light emitted from the light emitting element 731 may be irradiated only to the corresponding button 611 via the through-bore 714 of the switch 710.

As is apparent from the above description, the present embodiment provides a switch assembly and an air conditioner having the same, wherein a switch and a circuit board are detachably coupled to each other in a hook coupling manner, whereby maintenance and assembly performance of the switch assembly may be enhanced and a user may accurately recognize an input part via a light emitting element of the circuit board.

Although an embodiment of the present invention has been shown and described, it would be appreciated by those skilled in the art that changes may be made in these embodiments without departing from the principles and spirit of the invention, the scope of which is defined in the claims and their equivalents.

What is claimed is:

1. A switch assembly comprising:
   a switch having a hollow conductive switch body;
   a button covering the conductive switch body;
   an elastic conductive connector to provide the switch with an elastic force; and
   a circuit board operatively coupled to the switch and the elastic conductive connector and configured to determine if the user touches the button based on the change in capacitance of the conductive switch body, the circuit board having a light emitting element mounted thereon,
   wherein the elastic conductive connector is arranged between the hollow conductive switch body and the circuit board such that light emitting by the light emitting element mounted on the circuit board irradiates through a first light travel path defined by the elastic conductive connector and a second light travel path defined by the hollow conductive switch body to illuminate the button.

2. The switch assembly according to claim 1, wherein the circuit board is detachably coupled with the switch.

3. The switch assembly according to claim 1, wherein the conductive switch body includes a cylindrical body defining an external appearance of the switch, and at least one fastening piece extending from the body and adapted to be hook-coupled to the circuit board.

4. The switch assembly according to claim 2, wherein the connector and the switch respectively include through-bores, through which light emitted from the light emitting element is irradiated to illuminate the button.

5. The switch assembly according to claim 4, wherein the through-bore of the switch body includes a first hole in contact with the elastic connector, and a second hole having a diameter larger than a diameter of the first hole to allow the light having passed through the first hole to be irradiated to the outside.

6. The switch assembly according to claim 1, wherein the switch body includes a seating recess for placement of the elastic connector.

7. The switch assembly according to claim 6, wherein the elastic connector is placed in the seating recess and is made of a flexible gasket material to achieve electrical conduction between the switch and the circuit board when the switch is pushed.

8. The switch assembly according to claim 2, wherein the light emitting element includes a Light Emitting Diode (LED).

9. The switch assembly according to claim 1, wherein the switch is plated with chrome.

10. The switch assembly according to claim 1, wherein the switch includes a supporting piece configured to be inserted into the circuit board.

11. The switch assembly according to claim 3, wherein the fastening piece includes a protrusion to be caught by the circuit board.

12. An air conditioner comprising:
    a switch having a hollow conductive switch body, and
    a button covering the conductive switch body;
    wherein the switch assembly comprises:
    a conductive switch provided at a position corresponding to the button,
    an elastic conductive connector to provide the switch with an elastic force, and
    a circuit board detachably coupled to the switch and the elastic conductive connector and configured to determine if the user touches the button based on the change in capacitance of the conductive switch body, the circuit board having a light emitting element mounted thereon,
    wherein the elastic conductive connector is arranged between the hollow conductive switch body and the circuit board such that light emitting by the light emitting element mounted on the circuit board irradiates through a first light travel path defined by the elastic conductive connector and a second light travel path defined by the hollow conductive switch body to illuminate the button.

13. The air conditioner according to claim 12, wherein the circuit board includes at least one Light Emitting Diode (LED) to selectively emit light.

14. The air conditioner according to claim 12, wherein the switch includes a fastening piece to be hook-coupled to the circuit board.

15. The air conditioner according to claim 13, wherein each of the connector and the switch includes at least one through-bore to prevent dispersion of the light emitted from the LED.

16. The air conditioner according to claim 15, wherein the connector is made of a flexible gasket material.

17. The switch assembly according to claim 1, wherein; when the circuit board determines that the button has been touched, the circuit board is configured to activate the light emitting element mounted thereon to illuminate the button, for providing feedback to the user that the touch has been recognized.

18. A touch sensitive button assembly including a first button and a second button, the assembly comprising:
    a first switch having a hollow conductive switch body which is covered by the first button and an elastic conductive connector to provide the conductive switch body with an elastic force;
    a second switch having a hollow conductive switch body which is covered by the first button and an elastic conductive connector to provide the conductive switch body with an elastic force; and
    a circuit board operatively coupled to the first switch and the second switch and having a component configured to determine if the user touches one of the first and second based on a change in capacitance of each respective of the first and second switches, the circuit board having a first light emitting element mounted on the circuit board to irradiate light through a first light travel path defined by the elastic conductive connector of the first switch and a second light travel path defined by the hollow conductive body of the first switch to illuminate the first button, and a second light emitting element mounted on the circuit board to irradiate light through a light travel path defined by the elastic conductive connector of the second switch and a second light travel path defined by the hollow conductive body of the second switch to illuminate the second button.

19. The touch sensitive button assembly of claim 18, wherein the component of the circuit board determines that the button corresponding to the first switch has been touched, the component of the circuit board is configured to activate the first light emitting element mounted thereon to illuminate the button corresponding to the first switch, for providing feedback that the touch of the first switch has been recognized, and when the component of the circuit board determines that the button corresponding to the second switch has been touched, the component of the circuit board is configured to activate the second light emitting element mounted thereon to illuminate the button corresponding to the second switch, for providing feedback that the touch of the second switch has been recognized.

* * * * *

UNITED STATES PATENT AND TRADEMARK OFFICE
CERTIFICATE OF CORRECTION

PATENT NO. : 8,203,091 B2  
APPLICATION NO. : 12/585008  
DATED : June 19, 2012  
INVENTOR(S) : Gyung Yeun Kang et al.

Page 1 of 1

It is certified that error appears in the above-identified patent and that said Letters Patent is hereby corrected as shown below:

Title Page Column 2 item (74), (Attorney, Agent, or Firm), Line 1, Delete "Ataas" and insert -- Staas --, therefor.

Signed and Sealed this
Fourth Day of September, 2012

David J. Kappos
*Director of the United States Patent and Trademark Office*